United States Patent
Walls et al.

(10) Patent No.: US 10,705,134 B2
(45) Date of Patent: Jul. 7, 2020

(54) HIGH SPEED CHIP SUBSTRATE TEST FIXTURE

(71) Applicant: International Business Machines Corporation, Armonk, NY (US)

(72) Inventors: Lloyd A. Walls, Austin, TX (US); Nam H. Pham, Round Rock, TX (US); Jason R. Eagle, Mantorville, MN (US); Nathan L. Dunfee, Rochester, MN (US); Pavel Roy Paladhi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 149 days.

(21) Appl. No.: 15/830,051

(22) Filed: Dec. 4, 2017

(65) Prior Publication Data

US 2019/0170809 A1    Jun. 6, 2019

(51) Int. Cl.
| | | |
|---|---|---|
| *G01R 31/28* | (2006.01) | |
| *H05K 1/02* | (2006.01) | |
| *H01L 23/498* | (2006.01) | |
| *H01L 23/66* | (2006.01) | |
| *G01R 1/04* | (2006.01) | |
| *G01R 1/067* | (2006.01) | |

(52) U.S. Cl.
CPC ....... *G01R 31/2808* (2013.01); *G01R 1/0408* (2013.01); *G01R 1/06722* (2013.01); *G01R 31/2889* (2013.01); *H01L 23/49822* (2013.01); *H01L 23/49838* (2013.01); *H01L 23/66* (2013.01); *H05K 1/0243* (2013.01); *G01R 1/0466* (2013.01); *H01L 2223/6616* (2013.01); *H01L 2223/6627* (2013.01); *H05K 2201/10189* (2013.01); *H05K 2201/10325* (2013.01); *H05K 2201/10393* (2013.01)

(58) Field of Classification Search
CPC .......... H01L 2223/6616; G01R 1/0466; G01R 31/2889
See application file for complete search history.

(56) References Cited

U.S. PATENT DOCUMENTS

| | | | |
|---|---|---|---|
| 5,477,160 A | 12/1995 | Love | |
| 6,305,230 B1 * | 10/2001 | Kasukabe | .......... G01R 31/2889 73/855 |
| 6,501,278 B1 | 12/2002 | Arabi | |
| 7,476,553 B2 | 1/2009 | Hara et al. | |
| 8,508,239 B2 | 8/2013 | Valcore | |
| 8,981,237 B2 | 3/2015 | Ono et al. | |

(Continued)

FOREIGN PATENT DOCUMENTS

CN    105067846 A    11/2015

*Primary Examiner* — Alvaro E Fortich
(74) *Attorney, Agent, or Firm* — Monchai Chuaychoo

(57) ABSTRACT

An apparatus, multi-layer semiconductor substrate and system for testing a high-speed signal through a printed circuit board is provided. Embodiment of the present invention provides an apparatus comprises a multi-layer substrate, one or more transmission lines disposed within the multi-layer substrate, one or more connectors attached to the multi-layer substrate for connecting one or more test cards, a lid, comprising one or more cutouts for the one or more connectors, a clamp for compressing the multi-layer substrate against the lid, and one or more high-speed connectors attached to the one or more test cards, respectively.

20 Claims, 5 Drawing Sheets

(56) References Cited

U.S. PATENT DOCUMENTS

| | | | | |
|---|---|---|---|---|
| 2004/0128094 A1* | 7/2004 | Blanc | ......................... | H04L 1/20 |
| | | | | 702/84 |
| 2005/0013355 A1* | 1/2005 | Smith | ..................... | H04B 17/18 |
| | | | | 375/224 |
| 2007/0040565 A1* | 2/2007 | Jayabalan | ........... | G01R 31/2831 |
| | | | | 29/593 |
| 2008/0143355 A1 | 6/2008 | Delabouglise | | |
| 2010/0019377 A1* | 1/2010 | Arvelo | .................. | H01L 21/563 |
| | | | | 257/712 |
| 2010/0109679 A1* | 5/2010 | Frech | ................... | G01R 31/025 |
| | | | | 324/628 |
| 2012/0007229 A1* | 1/2012 | Bartley | ............... | H01L 25/0657 |
| | | | | 257/712 |
| 2014/0024465 A1* | 1/2014 | Bodenweber | ....... | H05K 7/20127 |
| | | | | 463/46 |

\* cited by examiner

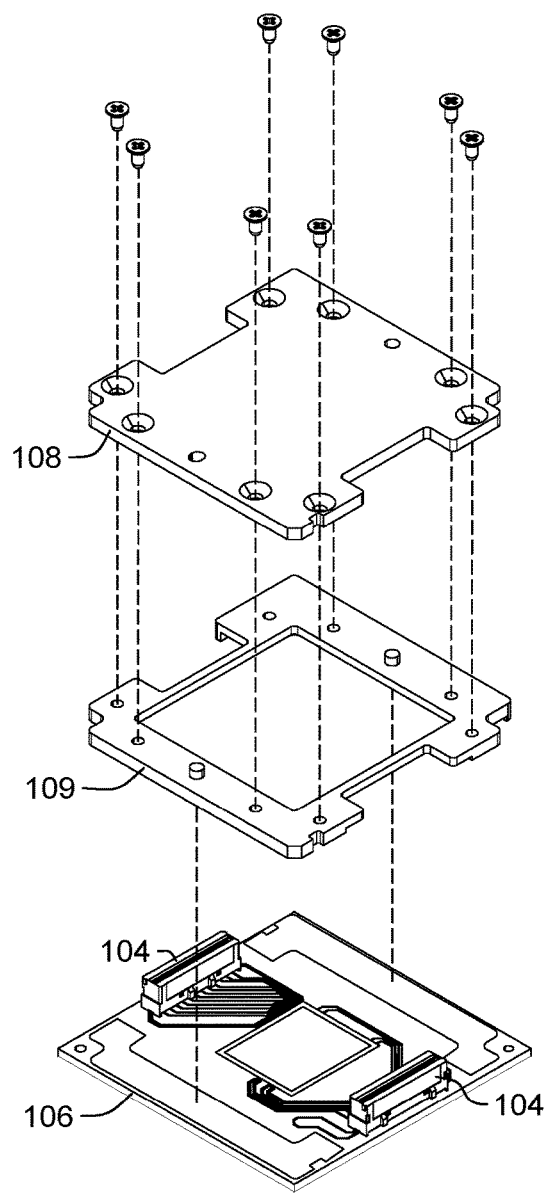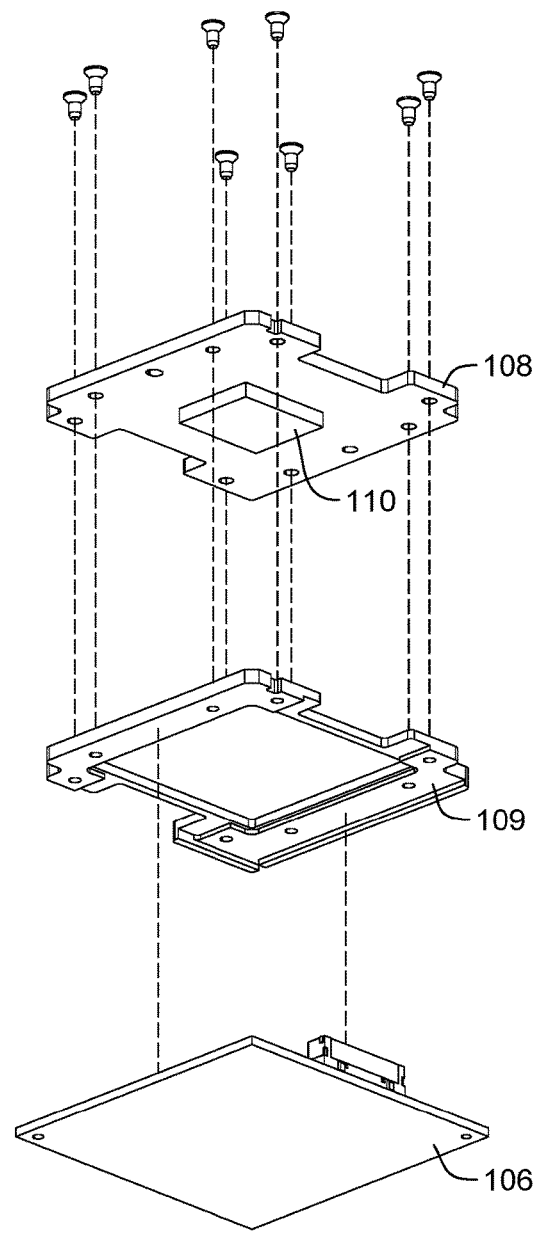
FIG. 2A
FIG. 2B

HIGH SPEED CHIP SUBSTRATE TEST FIXTURE

BACKGROUND OF THE INVENTION

The present invention relates generally to the field of integrated circuit manufacturing and more particularly to testing an integrated circuits, module substrates, system boards, and attached cables.

Due to the small geometries at the chip controlled collapse chip connection (C4) level it is very difficult to be able to launch a high quality signal at the top of a substrate at the chip interface in order to analyze the signal path from the chip, interface, through the substrate and on to a motherboard and other components such as cables and cards that may be in that path.

A common way to test the quality of a high signal is to evaluate it in a fully functional system using integrated circuits that designed to capture the data being transferred between driver and receiver. While this method is effective in determining if the systemfunctions correctly it is limited since the transmitted signal cannot be significantly changed and the received waveform cannot be analyzed in detail. The embodiment herein does not require a functional system nor does it require an integrated circuit to be present. This allows signal integrity measurements of selected paths on a system before it becomes fully functional without the presents of an integrated circuit.

The traditional testing method without an integrated circuit present is to use pico-probes to inject a signals at the top surface of the substrate. This method is limited by the fact that the dimension of the C4 pad and the spacing between the C4 pads is small while the size of the pico-probe is large with respect to these pads. This limits the number of probes that can be connected to the top surface of a substrate disrupt the quality of the signal being injected since the probe itself creates a discontinuity in the impedance of system. The gross mismatch in pad to probe geometries also limit the selection of signal that can be simultaneously contacted which limits the scope of what is possible to analyze. Another approach would be to re-design the substrate (chip carrier or module) to spread out the C4 pads to make them more accessible. However, this may significantly alter the integrity of the substrate and the internal wiring to an extent where it does not truly represent the impedance network that will be seen by the actual product leading to false assumptions about the integrity of the signal path.

Hence, there exists a need to improve the testing of signal integrity of wiring in a substrate.

SUMMARY

According to an embodiment, an apparatus for testing a high-speed signal through a printed circuit board, the apparatus comprising: a multi-layer substrate; one or more transmission lines disposed within the multi-layer substrate; one or more connectors attached to the multi-layer substrate for connecting one or more test cards; a pressure plate, comprising one or more cutouts for the one or more connectors; a clamp for compressing the lid on to the multi-layer substrate and also against a high-speed connector attached to one or more test cads respectively.

According to another embodiment, a multi-layer semiconductor substrate for high speed circuit testing, the multi-layer semiconductor substrate comprising: an upper construct layer; a lower construct layer; one or more intermediate construct layers interposed between the upper construct layer and the lower construct layer; a plurality of high-speed signal traces providing connections to an outer surface of the upper construct and an outer surface of the lower construct and passing through the one or more intermediate construct layers; one or more ground-return-vias connecting the upper construct layer and the adjacent intermediate construct layer; and one or more closed loop signal traces etched on the upper construct layer for minimizing electrical noise.

According to another embodiment, a system of for testing a high speed signal through a printed circuit board, the system comprising: a substrate; a transmission line disposed within the substrate; one or more connectors attached to the substrate for connecting one or more test cards; a pressure plate, comprising one or more cutouts for the one or more connectors; a clamp for compressing the substrate against the pressure plate and lid; one or more high-speed connectors attached to the one or more test cards, respectively; and a signal analyzer connected to the one or more high speed connectors.

BRIEF DESCRIPTION OF THE DRAWINGS

FIG. 2A is a top view, depicting a partially exploded view, of the SI test module assembly of the SI test fixture device in accordance with one embodiment of the present invention;

FIG. 2B is a bottom view, depicting a partially exploded view, of the SI test module assembly of the SI test fixture device in accordance with one embodiment of the present invention;

DETAILED DESCRIPTION

Figure 1:
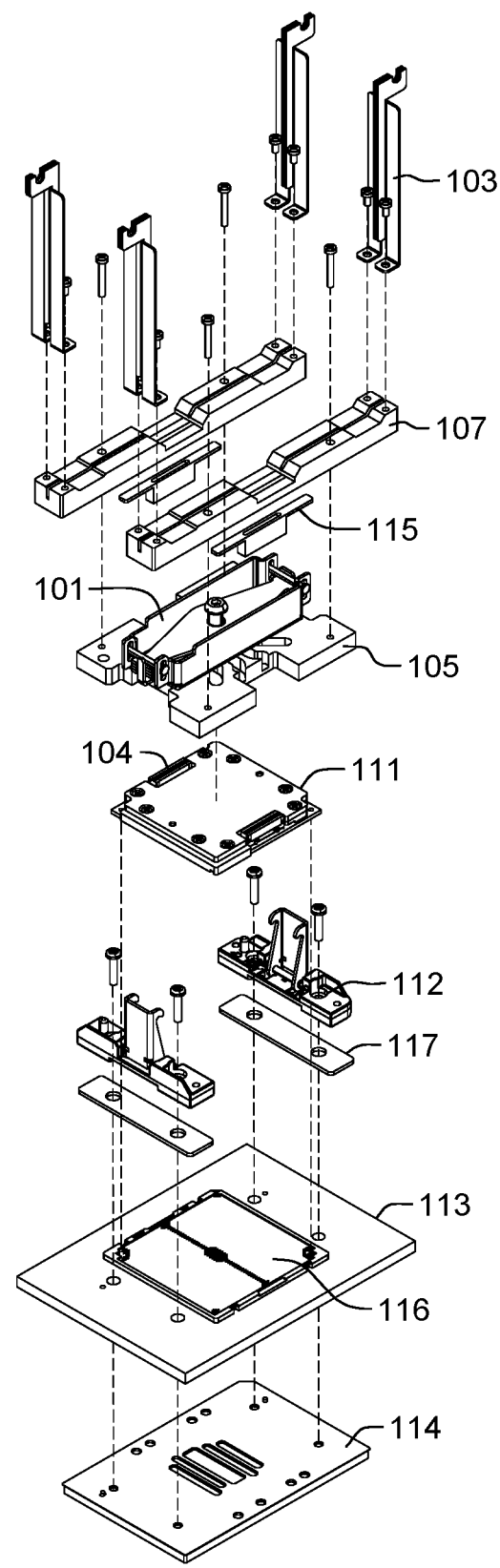
FIG. 1 is an exterior perspective view of the signal integrity (SI) test fixture device, partially exploded view of the entire fixture, in accordance with an embodiment of the present invention.

Embodiments of the present invention recognize that improvements to testing signal through a semiconductor chip (e.g., C4, etc.), substrate, and motherboard by modifying existing test fixture design. Existing test fixture does not allow measurement of random bit pattern on a full channel which includes the substrate, card, connector, and cable due to the number and size of the probe tip. Furthermore, existing test methodology does not allow a vector network analyzer (VNA) on discontinuity with multiple components in the channel path. The modifications of the present invention include adding an additional layer to the existing substrate of the test fixture, adding one or more unique loops like pattern on the substrate to electrically characterize portions of the signal path that are only needed for signal delivery and remove those characteristics from the measurement of interest, modifying unused connection patterns within the substrate itself, the use of surface micro-strip wire with lateral and vertical shielding and the use of connectors for probing. These improvements allow the user to evaluate the signal integrity of wiring in a substrate. In addition, the present invention enables the user to launch and receive multiple high quality signals into the substrate, and system board.

Embodiments of the present invention will now be described in detail with reference to the accompanying figures. It is to be understood that the disclosed embodiments are merely illustrative of potential embodiments of the present invention and may take various forms. In addition, each of the examples given in connection with the various embodiments is intended to be illustrative, and not restrictive. Further, the figures are not necessarily to scale, and elements and features can have different dimensions than those depicted in the figures. Therefore, specific structural and functional details disclosed herein are not to be interpreted as limiting, but merely as a representative basis for teaching one skilled in the art to variously employ the present invention.

References in the specification to "an exemplary embodiment," and "other embodiments," etc., indicate that the embodiment described may include a particular feature, structure or characteristic, but every embodiment may not necessarily include the particular feature, structure or characteristic. Further, when a particular feature, structure, or characteristic is described in connection with an embodiment, it is submitted that it is within the knowledge of one skilled in the art to affect such feature, structure or characteristic in connection with other embodiments whether or not specifically described.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

The term "construct", along with its derivatives, may be used herein. "Construct" may mean the following. "Construct" may mean a one or more elements making up a substance such as in a layer of substrate.

There are several approaches that are disclosed as different embodiments of the present invention that can be used to launch the signal in to the substrate. An example or embodiment of this approach, includes the use of a surface mounted connector, rigid coax cable and tri-lead cable. The tri-lead cable can include a differential pair and a ground lead or a combination of any of those elements. This example of the approach does not require a chip, a powered card, or other components mounted on a card except for those needed to attach the fixture itself. This approach is completely static except for externally supplied excitation equipment and measurement tools. In addition, this allows the user to connect to multiple signals at the same time, whereas, the current technology is restricted to one or two differential connections. This design allows the injection of real bit patterns instead of a repetitive single frequency signal generated by a time domain reflectometer (TDR) and/or vector network analyzer (VNA).

Another approach of testing exists wherein the current C4 socket fixture is modified to house various elements (e.g., powered card, surface mounted connectors, etc.). However, the best implementation of an embodiment of this invention uses a surface mount connector without a mechanical guide to relieve the stresses that may be imposed by connecting cables and without using an actual chip (e.g., C4, etc.). This allows designer to test the signal integrity of the substrate well in advance of chip being manufactured.

In another embodiment, the design can be extended to include communication within the same laminate substrate where the signal path connect one side of the same chip die to another side of the chip. Or the path could connect one chip die to another chip die that is mounted on the same laminate substrate. The signal path can also be between two different chips on the same die and also connect to the system board in a multi-chip module (MCM).

In yet another embodiment, the present design can be used to test multiple chip dies (e.g., dual-chip modules (DCM), quad-chip modules (QCM), etc.) on a substrate. For example, two chip dies (e.g., DCM) are mounted on the same substrate and are connected by signal trace wiring. The dies are further connected to the test probes by conventional methodology. It is noted that the connection between the two dies within the substrate can be further connected to LGA pins but not required.

FIGS. 1-5 illustrates an embodiment of the present invention. Essentially, a single-ended or differential lines are routed on the newly added "TOP" layer of a substrate and then routed to the C4 location to be tested. These top surface traces need to be wider than those used internally to maintain the proper impedance. The power and ground connections that are ordinarily routed to the chip at the C4s will not interfere with these connections because those connections are need only be connected from the original "TOP" to the new TOP layer. In addition, signals that are not part of the group of signals that connect to the connector are also connected to ground to simulate non-switching signals. These traces, although grounded also contribute to the impedance profile where they pass near the signals traces of interest. This greatly relieves the wiring constraints from the C4 locations to the surface mounted connector. It is noted that a very small lateral adjustment to the original C4 connection on the original "TOP" layer may be necessary to in order to accommodate the spacing requirements needed by the traces at the surface. For signal integrity purposes, ground returns vertical-interconnect-access or vias are need to be added near the surface mounted connector and near the C4, but again these will not interfere with routing on the newly added TOP surface. A socketed printed circuit board (PCB) board will be inserted into the surface mounted connector. This card is connected to the surface mounted connector. The surface mounted connecter is coupled to the surface routed wires (e.g., surface micro-strip wire) and then to the C4 connections and to the ground plane on the TOP surface. It is noted that the signals routed using the single-ended lines need a common ground connection and path near the trace to maintain their impedance. The signal can then travel through traces in the substrate that are identical to those in a production module and onto a card that is also identical to that in the real product.

FIG. 1 is a exploded view of the signal integrity (SI) test fixture device, designated 100, in accordance with an embodiment of the present invention.

FIG. 2A is a top view depicting an SI test module assembly 111 of the SI test fixture device in accordance with one embodiment of the present invention.

FIG. 2B is a bottom view depicting an SI test module assembly 111 of the SI test fixture device in accordance with one embodiment of the present invention.

SI test fixture 100 comprises of spring assembly 101, printed circuit board (PCB) card edge holder 103, card connector 104, pressure plate 105, laminate substrate 106, card block guide 107, fastened lid 108, bonded lid 109, pedestal 110, SI test module assembly 111, latch assembly 112, system board 113, back side stiffener 114, retention force stabilizer 115, socket 116 and 117 spacers.

In an embodiment, spring assembly 101 is a mechanism that applies pressure of laminate substrate 106, including a socket layer and to system board 113 spring assembly 101 is coupled with the latch assembly 112. Latch assembly 112 provides the top of the assembly guide to be secured to two "posts" with a notch. Each inverted notch on each posts provide a "lock" that prevents the top portion of latch assembly 112 from moving upwards and away from pressure plate 105 and SI test module assembly 111. It is noted that there is a spring element that provides the force necessary to clamp down the structure onto the rest of the SI test fixture.

In an embodiment, printed circuit board (PCB) card edge holder 103 provides a guide to hold the two edges of a PCB card securely against card block guide 107. Card block guide has in the middle to allow the PCB card connection to protrude through to the card connector 104.

In an embodiment, card connector 104 provides an electrical attachment point for a PCB cards to be attached to laminate substrate 106. Card connector 104 can contain several pins for electrical attachments but it is the unique shape that allows it to mate perfectly to a variety of PCB cards. However, a liberal amount of solder is used to connect card connector 104 against laminate substrate 106. It is noted that card connector 104 works in tandem with retention force stabilizer 115 in order to provide a solid connection to PCB cards.

In an embodiment, retention force stabilizer 115 provides an element that prevents card connector 104 from separating from laminate substrate 106 whenever an inserted PCB card is pulled out from card connector 104. It is possible that there solder connection between card connector 104 and laminate substrate 106 may not be strong enough to prevent separation should the PCB cards be pulled out.

In an embodiment, pressure plate 105 provides the upper structure for spring assembly 101 to be fastened towards laminate substrate 106. Furthermore, pressure plate 105 can provide the force needed to deflect the spring like pin connections of the connector which lies between the substrate 106 and the system board 113.

In an embodiment, SI test module assembly 111 contains laminate substrate 106, fasted lid 108, bonded lid 109, pedestal 110 and non-contact C4 cut-out 118. SI test module assembly 111 will be discussed in greater details regarding FIGS. 2A and 2B.

In an embodiment, system board 113 provides a connection to other components. For example, system board 113 can include a variety of electrical traces that connect to components, other cards, or other connectors (e.g., motherboards with central processing unit) with numerous style of chip socket connections (e.g., LGA, BGA, QFN, etc.).

In an embodiment, back side stiffener 114 provides support against system board 113. Back side stiffener 114 is made from a metallic composition that doesn't deform greatly under force. System board 113 through spring assembly 101 exerts a pressing force of at least 400 pounds per square inch on top of back side stiffener 114. Therefore, it is essential that back side stiffener 114 made from materials that can withstand such force.

In an embodiment, socket 116 provides an electrical connection between laminate substrate 106 to system board 113. Referring to FIG. 1, socket 116 sits adjacent to system board 113. It is noted that there spring loaded contacts (not shown) that allows the connection between substrate 106 and system board 113. The details of this spring loaded contacts are discussed in further detail with regards to FIG. 3.

In an embodiment, spacers 117 provides additional height for latch assembly to provide the correct load or force to the SI test module assembly when the fixture is attached to the system board 113.

Referring to FIGS. 2A and 2B, showing the SI test module assembly 111, SI test module assembly 111 comprises of laminate substrate 106, fastened lid 108, bonded lid 109, pedestal 110 and non-contact route keep out area 118. The pedestal 110 shown on top lid 108 is designed to take the place of the integrated circuit and transfer the pressure execrated by the pressure plate to insure that the center of the substrate provides the correct pressure on socket pins and thus make proper connection.

In an embodiment, laminate substrate 106 is a multi-layer planar substance that is commonly used in integrated circuits. Laminate substrate 106 makes it possible to simulate and test various signals into a substrate without a presence of a chip. As mentioned in earlier paragraphs, laminate substrate 106 contains two unique layers, a new "TOP" layer and second layer adjacent to the old bottom layer. These two important and distinct layers will be discussed in greater details in FIG. 3.

In another embodiment, laminate substrate 106 contains multiple layers which includes wiring and grounding layers. For example, at least eight layers were used specific for this application. However, this fixture can be applied to, other substrate stack utilizing less or more layers as the application dictates. It is noted that a minimum layer required for this application is four layers. However, laminate substrate 106 can be as many layers as required for the testing application.

In an embodiment, fastened lid 108 of the present invention provides additional layer for propping up the rest of the fixture such as spring assembly 101, card guide block 107, and pressure plate 105. In an embodiment, fastened lid 108 contains a solid C4 chip shape "pillar", pedestal 110, used to provide a load for the structure. For example, since there is not a C4 chip connected, fastened lid 108 uses pedestal 110 in the empty C4 space as a load bearing support.

In an embodiment, bonded lid 109 is adjacent to the top most layer of laminate substrate 106. In another embodiment, bonded lid 109 provides an additional layer to substrate 106. Bonded lid 109 contains a unique cut out on the underneath portion. The cutout prevents the metal portion of bonded lid 109 from coming in contact with wires routed on the top surface of laminate substrate 106 forming a "route keep out" for microstrip wires that are routed to card connector 104. Non-contact C4 cut-out 118 is configured as not to contact the wiring trace for the C4 sockets.

Figure 3:
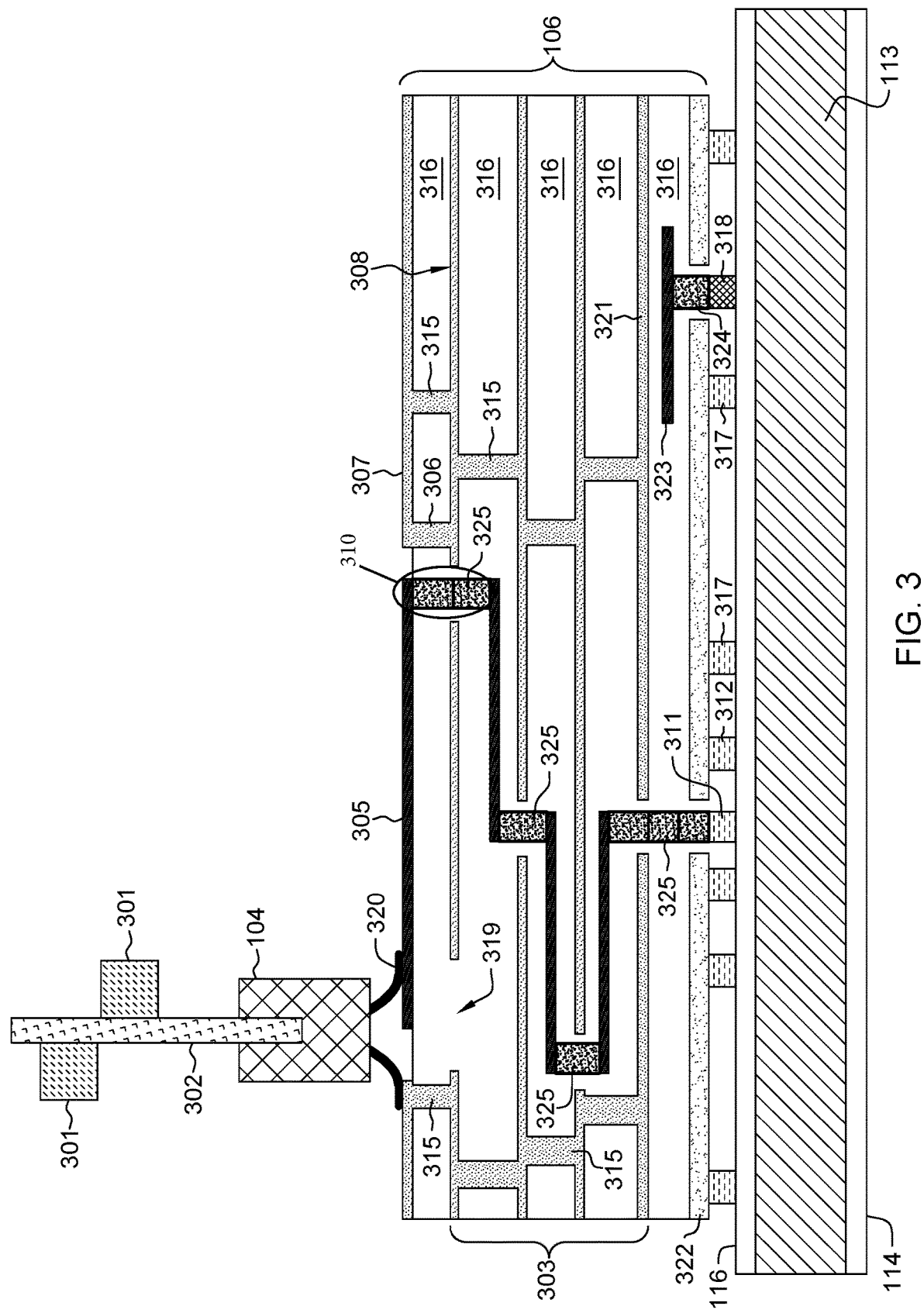
FIG. 3 depicts a cross section view illustrating the SI test fixture with a substrate, in accordance with an embodiment of the present invention.

FIG. 3 depicts a cross section view illustrating the SI test fixture in accordance with an embodiment of the present invention. The cross section view illustrating the SI test fixture comprises of, card connector 104, system board 113, socket 116, laminate substrate 106, high speed connectors 301, PCB card 302, signal trace 305, ground (GND)-return-VIA 306, GND plane 307, intermediary layers 303, old top layer 308, signal trace bottom 309, C4 connection point 310, signal land grid array (LGA) 311, GND LGA 312, vias 315, insulators 316, GND reference plane LGA 317, isolated power LGA 318, void 319, connector lead 320, old bottom layer 321, new bottom layer 322, anchor layer 323, anchor via 324 and trace via 325.

In an embodiment, card connector 104 attaches to the top most layer of laminate substrate 106 along with several of the leads, such as signal traces 305. It is noted that test signals can be launched and received on another similar card connector such as card connector 104 at the same time.

In an embodiment, PCB card 302 of the present invention provides connection for high speed connectors 301. PCB cards can be made into various shapes depending on the demand of the connectors. For example, in the present embodiment, a rectangular shaped PCB card 302 is provided.

A special connector or cable connection designed for high speed use (e.g., high speed connectors 301) is a crucial part of the test setup that is required in order to obtain optimal results. In an embodiment, high speed connectors 301 (e.g., SMA connectors, etc.) of the present invention contains all the electrical connection and/or attachment points for the test probes. The test signals are generated by a signal analyzer. It is noted that the term "signal analyzer" or "signal quality analyzer" includes test instrument or equipment that can generate test signal and receive those test signals back as well. For example, a signal analyzer can be an Anritsu MP1800A BERT instrument.

In an embodiment, signal trace 305 of the present invention allows the signal from the signal analyzer to reach through system board 113 via substrate 106. Signal traces 305 lies in the same plane as GND plane 307 but is not connected to it. In an embodiment, signal trace 305 allows the signal to quickly go through the substrate to its final destination. It is noted that single ended signals or non-differential signals will require a return path to ground. However, if using a differential pair, one leg of the pair acts as the return path for the other. It is further noted that in some rare cases, it might be desirable to float one or more power connections to the system board especially if an active cable needs power.

In an embodiment, trace via 325 of the present invention provides electrical connection in form of a VIA for signal trace 305 to connect from the top layer all the way through the various layers to the very bottom layer of the laminate substrate 106.

In an embodiment, GND-return-VIA 306 of the present invention provides a return path when connecting single ended signals and should be placed as close as practical to the C4 connection point 310 as it transitions from the top layer to layers below. Furthermore, GND-on-top layer 307 provides the ground connection between the middle layers of the substrate to the top substrate by GND-return-VIA 306 connection.

In an embodiment, old top layer 308 of laminate substrate 106 sits adjacent to intermediary layer 303. In an embodiment, old top layer 308 contains a grounding layer of laminate substrate 106. However, in the embodiment of this invention, an additional "TOP" layer, GND plane 307, was added to old top layer 308.

In an embodiment, GND plane 307 of the present invention is a newly added layer to old top layer 308. GND plane 307 provides a new layer which contains new grounding traces which aids in improvement of signal testing. A ground plane is an area where a metal evenly distributed over a wide area on a surface. These power or voltage planes are used widely within industry to provide isolation between signals on different layers as well provide a signal return path for single ended nets (those with one conductor) and to shield signals on the same plane from one another.

In an embodiment, signal trace bottom 309 of the present invention allows high speed signal trace 305 to connect various LGA pins (e.g., signal LGA 311) at the bottom most layer of the laminate but does not connect to the plane at the bottom of the substrate.

In an embodiment, C4 connection point 310 of the present invention designates an area where the C4 would have been connected to laminate substrate 106. In another embodiment, signals follows a path, signal traces 305, towards C4 connection point 310. C4 connection point 310 of the present invention provides the location for the new via (e.g., the first via 325) between old top layer 308 and new top layer are the same except for that first one that joins the new top to the old top layer.

In an embodiment, signal land grid array (LGA) 311 of the present invention provides a signal path to the system board and does not short to the power plane. Therefore, if using a differential pair, one leg of the pair acts as the return path for the other, In an embodiment, GND LGA 312 of the present invention acts as the return path of signal LGA 311. It is noted that both differential and single ended signals follows a path to the bottom of laminate 106. It is further noted that in some rare cases, it might be desirable to float one or more power connections (not shown) for the LGAs (e.g., GND LGA 312, Signal LGA 311) to the system board especially if an active cable needs power.

In an embodiment, vias 315 of the present invention provides electrical connection between each electrical layer. Each electrical layer is sandwiched between layers of insulators 316. It is noted that it is possible for other voltages to be used as a reference for the signals regarding to vias.

In an embodiment, LGA contacts 317 of the present invention are spring loaded contacts (not shown) that attaches laminate substrate 106 to socket 116. There are multiple LGA contacts 317 and each are connected to each LGAs (e.g., isolated LGA 318, etc) to laminate substrate 106.

In an embodiment, isolated LGA 318 of the present invention is a special LGA that does not connected to the bottom most plane. Isolated LGA 318 would be electrically isolated from all other potentials in the substrate or missing (depopulated) all together. For example, if it is necessary to apply power to the system card to power on other devices like receivers or cables with active drivers and receivers then the user would not want to create a short circuit inside the substrate. Therefore, by floating (isolating) the pins at the LGA would prevent this short.

In another embodiment, isolated LGA 318 of the present invention is not electrically isolated from other metal pattern or traces inside of laminate substrate 106. The purpose of the isolation is to electrically isolate any power that might be applied to system board 113 from the creating a short circuit within the laminate substrate 106. This would allow devices such as drivers, receivers, active cable drivers or attached cards to be powered on system board.

In an embodiment, connector lead 320 of the present invention in the present embodiment provides an electrical connection between socket 104 to signal trace 305. There is a large pad (not shown) located between connector lead 320 and signal trace 305. The large pad works in conjunction with void 319 by reducing the capacitance (see void 319).

In an embodiment, void 319 of the present invention is located directly below each signal lead represented by connector lead 320. Void 319 is represented by a lack of conductive and non-conductive material in the GND plane. The purpose of which is to reduce the capacitance between the large pad (previously mentioned between connector lead 320 and signal trace 305) are required to attach socket 104 and the reference planes below and match the impedance used by the signal being tested. The distance between the pad at signal trace 320 and the next layer is increased by void 319. This decreases the capacitance to the pad at 320 and helps maintain the impedance of line 305.

In an embodiment, intermediary layers 303 of the present invention are a multi-layer substrate that has been modified to include a new TOP layer and new second layer, adjacent to the old bottom layer. It is noted that intermediary layers 303 is part of laminate substrate 106. It is further noted that laminate substrate 106 contains intermediary layers 303, GND-on-top layer 307, old top layer 308, old bottom layer 321 and new bottom layer 322.

In an embodiment, old bottom layer 321 of the present invention provides the last laminated layer of the previous laminate substrate 106. As previously mentioned, the improvements of the present invention can be made by adding a second layer to the previously existing bottom layer.

In an embodiment, new bottom layer 322 of the present invention provides a new layer that allows connectivity between old bottom layer 321 to system board 113. For manufacturing purposes, a second layer (not shown) must be added before the last layer, new bottom layer 322, of laminate substrate 106. The second layer contains a grounding layer. It is noted that the additional second layer is needed to make the connection from the previous old bottom layer 322 to new bottom layer 322 but is very similar to but not an exact replica of the last layer and will require an additional via and or a short link of metal needed to complete the connection between layers. Some minor personalization is needed which would include jogs in the wiring that are necessary to meet manufacturing ground rules will be necessary. It is noted that making the connection from the old bottom to the new bottom needs need to be made in a way so as to maintain the impedance of the signals in the laminate without adding significate length to the signal traces within the substrate. The ground connections also need to be contiguous. It is further noted vias can be used when applicable. If the vias are not used then a jog is used to connect from one layer to the new bottom layer.

In an embodiment, anchor layer 323 of the present invention provides a conductive metallic plane that spans horizontally across laminate substrate 106. Anchor layer 323 can be on the same "layer" as the signal but it is electrically isolated from the signal layer and the ground.

In an embodiment, anchor via 324 of the present invention provides an attachment point between laminate substrate 106 and isolated power LGA 318. It is noted that anchor layer 323 can provide a mechanical structure that ties isolated LGA 318 with laminate substrate 106.

Figure 4:
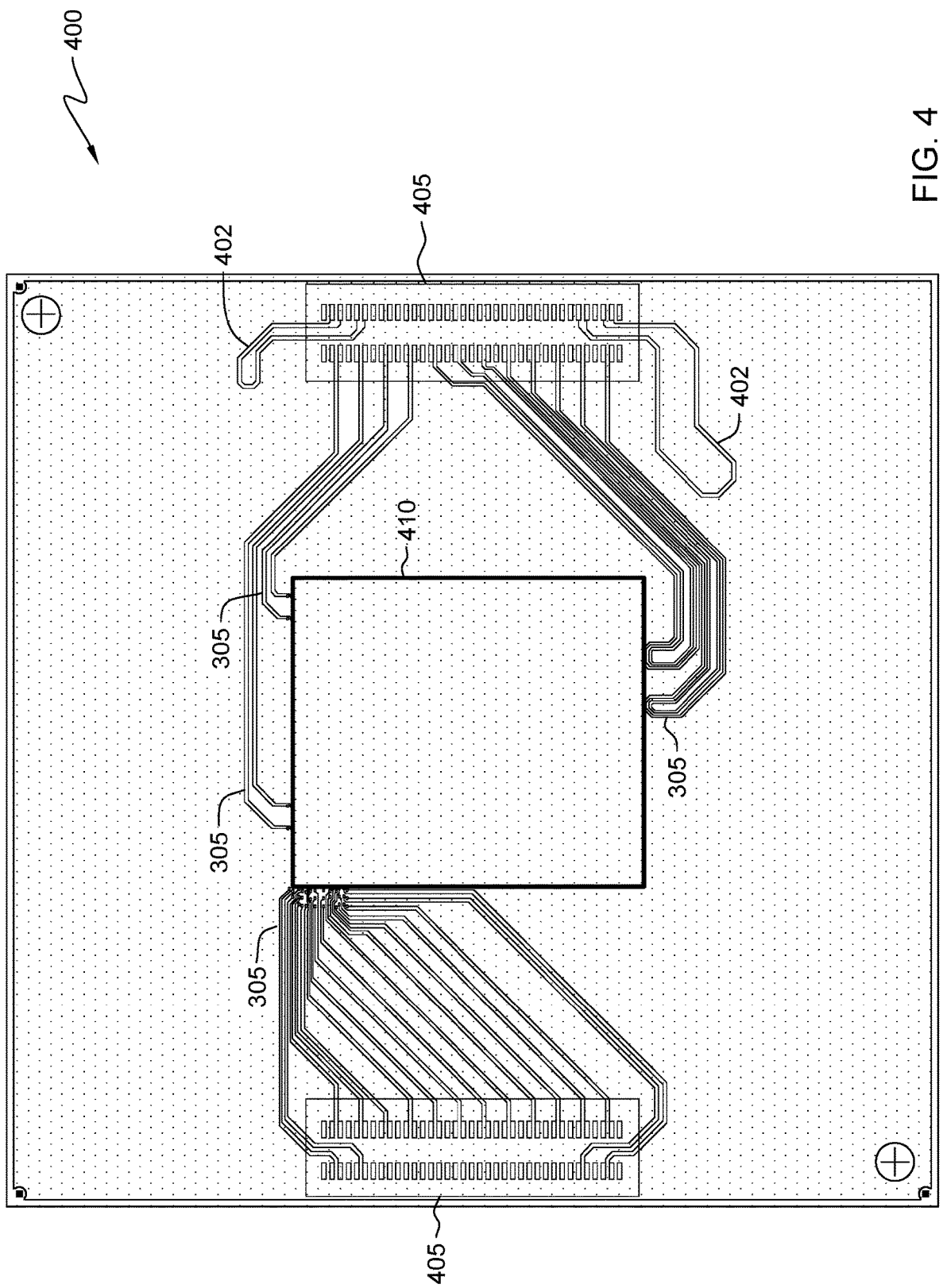
FIG. 4 depicts a top view of the substrate wiring for mating the C4 chip, designated 400, in accordance with an embodiment of the present invention.

FIG. 4 depicts a top view of the substrate wiring environment for mating the C4 chip, generally designated as 400, in accordance with an embodiment of the present invention. Substrate wiring environment 400 comprises of a chip footprint area 310 with location for C4 connection, one or more loops 402, connections made to vias at C4 footprint 410 of FIG. 3, signal trace 305 and socket mount locations 405. It should also be noted that the entire surface of the top is grounded except for the places where the top surface wires and spaces between the wires are present. The plane acts to shield the wires of C4 connect-trace 404 from one another. This is also true of the pad on the connectors.

Loops 402 of the present invention are used during VNA measurement as a reference to the signal to be "taken out" (de-embedded) for error adjustment of the return signal from the signal analyzer. These loops like patterns, etched on the top most layer of laminate substrate 106, are necessary in this embodiment since the accuracy of the signal measurement to the C4 locations will not be successful without the existence of top and bottom loops 402. The loops are used to sample the impedance environment on the substrate. The loops do not connect to the signal traces inside the chip-less substrate and are passive not active connections to socket mount 405. The loops are used as a way to remove or account for the loss that is introduced because of the trace lengths needed to connect the socket to the C4s. The length of the loops vary depending on the length of C4 connect-trace 404.

Signal trace 305 (from FIG. 3) of the present invention provides a path for the signal from both sockets 104 through connector lead 320 mounted at socket mount locations 405 to further test C4 footprint 410 within the substrate. Signal trace 305 can contain at least 16 pairs of connection, which allows better signal accuracy, and less noise. However, signal trace 305 can have as many pairs of connection as needed for the given application.

C4 footprint 410 of the present invention is a location where the C4s for a chip would typically be mounted. However, the main key point of this invention is that a C4 chip is not required and this SI test fixture can be used to evaluate the signal quality.

Figure 5:
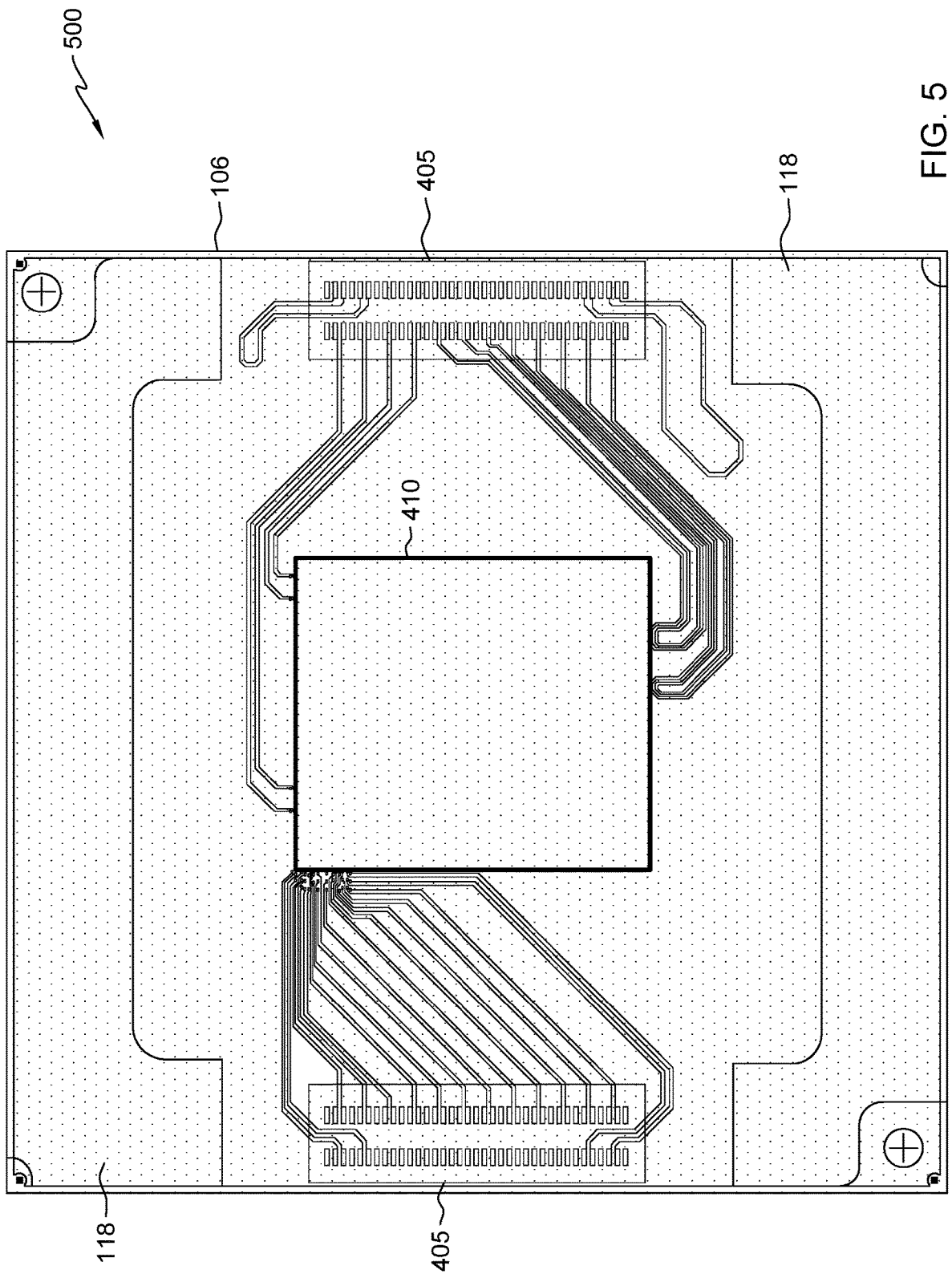
FIG. 5 depicts a top view of the SI fixture placement outline on top of the substrate, designated 500, in accordance with an embodiment of the present invention.

FIG. 5 depicts an alternative top view of the SI fixture placement on the C4 chip, in accordance with an embodiment of the present invention. SI fixture placement on the C4 chip environment 500 comprises of non-contact C4 cut-out 118, C4 connection 410 and C4 socket mount 405.

As depicted in FIG. 5, the bottom side of bottom lid 109, non-contact C4 cut-out 118, does not touch any wiring traces from socket mount 405 to C4 connection point 310. Furthermore, bottom lid 109 does not touch any of the one or more loops 402. Since bottom lid 109 is made from conductive material, it is important that bottom lid 109 does not come in contact with the wires on the surface because they will either create a short circuit or change the impedance of the traces.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An apparatus for testing a high-speed signal through a printed circuit board, the apparatus comprising:
   a multi-layer substrate, wherein the multilayer substrate comprises, a plurality of high-speed signal traces providing connections to an outer surface of an upper construct layer and an outer surface of a lower construct layer and passing through one or more intermediate construct layers;
   one or more transmission lines disposed within the multi-layer substrate;
   one or more connectors attached to the multi-layer substrate for connecting one or more test cards;
   a lid, comprising one or more cutouts for the one or more connectors, and the lid consisting of a fastened lid and a bonded lid held together, wherein the fastened lid comprises of an upper construct with of a C4 (controlled collapse chip connection) shape metallic pillar support located in the middle of the upper construct and the bonded lid comprising a lower construct with a four-sided polygon cut-out;

a clamp for compressing the multi-layer substrate against a pressure place and lid; and one or more high-speed connectors attached to the one or more test cards, respectively.

2. The apparatus of claim 1, wherein the one or more transmission lines further comprise an electrical connection between the multi-layer substrate and the one or more test cards.

3. The apparatus of claim 1, wherein the one or more test cards further comprise printed circuit board (PCB) cards.

4. The apparatus of claim 1, wherein the one or more connectors further comprise a slim-line socket for connecting PCB cards to the multi-layer substrate.

5. The apparatus of claim 1, wherein the lid further comprises an upper layer containing the C4 shape metallic pillar support and a bottom layer.

6. The apparatus of claim 5, wherein the bottom layer comprises the four-sided polygon cut out for the C4 shape metallic pillar support of the upper construct layer to pass through to the multi-layer substrate.

7. The apparatus of claim 1, wherein the one or more high-speed connectors further comprise a sub-miniature version A (SMA) type used for radio frequency (RF) cable connection.

8. A multi-layer semiconductor substrate for high speed circuit testing, the multi-layer semiconductor substrate comprising:

an upper construct layer;

a lower construct layer;

one or more intermediate construct layers interposed between the upper construct layer and the lower construct layer;

a plurality of high-speed signal traces providing connections to an outer surface of the upper construct layer and an outer surface of the lower construct layer and passing through the one or more intermediate construct layers;

a lid, comprising one or more cutouts for one or more connectors, and the lid consisting of a fastened lid and a bonded lid held together, wherein the fastened lid comprises of an upper construct with of a C4 (controlled collapse chip connection) shape metallic pillar support located in the middle of the upper construct and the bonded lid comprising a lower construct with a four-sided polygon cut-out;

one or more ground-return-vias or signal return vias connecting the upper construct layer and an adjacent intermediate construct layer; and one or more closed loop signal traces etched on the upper construct layer for minimizing electrical noise.

9. The multi-layer semiconductor substrate of claim 8, wherein the upper construct layer further comprises a grounding layer containing one or more grounding traces.

10. The multi-layer semiconductor substrate of claim 8, wherein the lower construct layer further comprises a grounding layer containing one or more grounding traces.

11. The multi-layer semiconductor substrate of claim 8, wherein the plurality of high-speed signal traces further comprise one or more electrical connections between a slim-line socket and a system board.

12. The multi-layer semiconductor substrate of claim 9, wherein the one or more ground-return-vias further comprises a via electrically connecting the one or more grounding traces of the upper construct layer and the adjacent intermediate construct layer.

13. The multi-layer semiconductor substrate of claim 11, wherein the one or more closed loop signal traces further comprise an electrical pathway connecting pairs of pins associated with the slim-line socket.

14. A system for testing a high speed signal through a printed circuit board, the system comprising:

a multilayer substrate, wherein the multilayer substrate comprises, a plurality of high-speed signal traces providing connections to an outer surface of an upper construct layer and an outer surface of a lower construct layer and passing through one or more intermediate construct layers;

a transmission line disposed within the multilayer substrate;

one or more connectors attached to the multilayer substrate for connecting one or more test cards;

a lid, comprising one or more cutouts for the one or more connectors and the lid consisting of a fastened lid and a bonded lid held together, wherein the fastened lid comprises of an upper construct with of a C4 (controlled collapse chip connection) shape metallic pillar support located in the middle of the upper construct and the bonded lid comprising a lower construct with a four-sided polygon cut-out;

a clamp for compressing the multilayer substrate against the lid;

one or more high-speed connectors attached to the one or more test cards, respectively; and a signal analyzer connected to the one or more high speed connectors.

15. The system of claim 14, wherein the one or more transmission lines comprises an electrical connection between the substrate and the one or more test cards.

16. The system of claim 14, wherein the one or more test cards comprises printed circuit boards (PCB) cards.

17. The system of claim 14, wherein the one or more connectors comprises a slim-line socket for connection PCB cards to the multilayer substrate.

18. The system of claim 14, wherein the lid further comprises an upper layer containing the C4 shape metallic pillar support and a bottom layer.

19. The system of claim 18, wherein the bottom layer comprises the four-sided polygon cut out for the C4 shape metallic pillar support of the upper layer to pass through to the multi-layer substrate.

20. The system of claim 14, wherein the one or more high-speed connectors further comprise a sub-miniature version A (SMA) type used for radio frequency (RF) cable connection.

* * * * *